(12) United States Patent
Li et al.

(10) Patent No.: US 10,509,276 B2
(45) Date of Patent: Dec. 17, 2019

(54) METHOD OF PRODUCING METAL ELECTRODE, ARRAY SUBSTRATE AND METHOD OF PRODUCING THE SAME, DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiaolong Li, Beijing (CN); Xiaoxiang Zhang, Beijing (CN); Huibin Guo, Beijing (CN); Mingxuan Liu, Beijing (CN); Wenqing Xu, Beijing (CN); Zumou Wu, Beijing (CN); Yongzhi Song, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/970,803

(22) Filed: May 3, 2018

(65) Prior Publication Data

US 2019/0094597 A1  Mar. 28, 2019

(30) Foreign Application Priority Data

Sep. 27, 2017 (CN) .......................... 2017 1 0888219

(51) Int. Cl.
*H01L 21/027* (2006.01)
*G02F 1/1343* (2006.01)
*H01L 27/12* (2006.01)
*H01L 29/45* (2006.01)
*H01L 29/49* (2006.01)
*H01L 29/786* (2006.01)
(Continued)

(52) U.S. Cl.
CPC .... *G02F 1/13439* (2013.01); *G02F 1/133553* (2013.01); *H01L 21/0274* (2013.01); *H01L 21/32139* (2013.01); *H01L 27/124* (2013.01); *H01L 27/1222* (2013.01); *H01L 27/1259* (2013.01); *H01L 27/1262* (2013.01); *H01L 27/1288* (2013.01); *H01L 29/458* (2013.01); *H01L 29/4908* (2013.01); *H01L 29/78669* (2013.01); *G02F 2203/02* (2013.01); *H01L 29/78678* (2013.01)

(58) Field of Classification Search
None
See application file for complete search history.

(56) References Cited

U.S. PATENT DOCUMENTS 6,614,493 B1 *  9/2003  Kim ................... G02F 1/136227
                                                    349/138
2003/0086046 A1 *  5/2003  You ................... G02F 1/133555
                                                    349/149

* cited by examiner

*Primary Examiner* — Cory W Eskridge
(74) *Attorney, Agent, or Firm* — Kinney & Lange, P.A.

(57) ABSTRACT

The present disclosure relates to a metal electrode, an array substrate and a method of producing the same, and a display device. In an embodiment, the method includes: forming a protection layer on a metal layer; patterning the protection layer to form a protection pattern, a profile of the protection pattern being the same as a profile of a predetermined pattern of the metal electrode; and etching a part of the metal layer not covered by the protection pattern to form the metal electrode, the metal electrode being covered by the protection pattern, wherein an etching anisotropy of the protection layer is larger than an etching anisotropy of the metal layer.

15 Claims, 5 Drawing Sheets

(51) Int. Cl.
*G02F 1/1335* (2006.01)
*H01L 21/3213* (2006.01)

METHOD OF PRODUCING METAL ELECTRODE, ARRAY SUBSTRATE AND METHOD OF PRODUCING THE SAME, DISPLAY DEVICE

CROSS-REFERENCE TO RELATED APPLICATION

This application claims priority to Chinese Patent Application No. 201710888219.3 filed on Sep. 27, 2017 in the State Intellectual Property Office of China, the disclosure of which is hereby incorporated by reference in its entirety.

TECHNICAL FIELD

The present disclosure relates to a field of semiconductor technology, and particularly to a method of producing a metal electrode, an array substrate and a method of producing the same, and a display device.

BACKGROUND

In the field of semiconductor technology, it is generally required to produce a metal electrode having a predetermined pattern. For example, a metal electrode with a specific pattern is generally formed as a pixel electrode, a wiring, and the like in an array substrate for a display device. When the metal electrode is produced, a metal layer is usually patterned, and the metal electrode having the predetermined pattern is achieved by an etching process.

SUMMARY

According to an aspect of the present disclosure, there is provided a method of producing a metal electrode. The method comprises: forming a protection layer on a metal layer; patterning the protection layer to form a protection pattern, a profile of the protection pattern being the same as a profile of a predetermined pattern of the metal electrode; and etching a part of the metal layer not covered by the protection pattern to form the metal electrode, the metal electrode being covered by the protection pattern, an etching anisotropy of the protection layer is larger than an etching anisotropy of the metal layer.

In some embodiments, the step of patterning the protection layer to form a protection pattern comprises: forming a photoresist layer over the protection layer; exposing and developing the photoresist layer to form a photoresist pattern, a profile of the photoresist pattern being the same as the profile of the predetermined pattern of the metal electrode; and etching a part of the protection layer not covered by the photoresist pattern to form the protection pattern, the protection pattern being covered by the photoresist pattern.

In some embodiments, after the step of etching a part of the metal layer not covered by the protection pattern to form a metal electrode, the metal electrode being covered by the protection pattern, the method further comprises: removing the photoresist pattern; and removing the protection pattern.

In some embodiments, after the step of etching a part of the protection layer not covered by the photoresist pattern to form the protection pattern, the protection pattern being covered by the photoresist pattern, the step of patterning the protection layer to form a protection pattern further comprises: removing the photoresist pattern.

In some embodiments, the method further comprises: removing the protection pattern to form the metal electrode.

In some embodiments, before the step of forming a protection layer on a metal layer, the method further comprises: forming the metal layer on a base substrate.

In some embodiments, a material of the protection layer comprises indium tin oxide (ITO).

In some embodiments, the metal electrode comprises at least one of a pixel electrode, a gate electrode, a source electrode, a drain electrode, a gate line, and a data line.

In some embodiments, a material of the metal layer comprises aluminum, copper, silver, or an alloy thereof.

In some embodiments, the step of etching a part of the metal layer not covered by the protection pattern comprises: etching the part of the metal layer by a wet etching process.

According to another aspect of the present disclosure, there is provided a method of producing an array substrate comprising the method of any one of the abovementioned embodiments.

In some embodiments, the method further comprises: forming the metal layer and at least one of a gate electrode, a gate line, a gate insulation layer, an active layer, a source electrode, a drain electrode, a data line, a passivation layer, and a planarization layer on a base substrate, the metal electrode comprises a pixel electrode.

According to yet another aspect of the present disclosure, there is provided an array substrate, the array substrate is produced by the method of any one of the abovementioned embodiments.

According to yet another aspect of the present disclosure, there is provided a display device comprising the array substrate of any one of the abovementioned embodiments.

In some embodiments, the display device comprises a reflective display device.

BRIEF DESCRIPTION OF THE DRAWINGS

In order to provide a more clear explanation of technical solutions according to embodiments of the present disclosure, there is provided a brief introduction of the attached drawings used in the embodiments hereinafter. Obviously, the attached drawings mentioned in the following description are merely used to illustrate some embodiments of the present disclosure. Those skilled in the art also could derive other accompanying drawings from these accompanying drawings without any creative work.

DETAILED DESCRIPTION OF THE EMBODIMENTS

In order to make the objectives, technical solutions, and advantages of the present disclosure more clear, embodiments of the present disclosure will be described in detail hereinafter in conjunction with the attached drawings.

In the semiconductor field, a liquid crystal display device is commonly a flat-panel display device. According to a type of a light source and an arrangement of the light source, the liquid crystal display device may be classified as a transmissive liquid crystal display device, a semi-transmissive liquid crystal display device, or a reflective liquid crystal display device. In a case of the reflective liquid crystal display device, it displays images by reflecting ambient light or reflecting light from the light source disposed in front of a display panel.

Figure 1A:
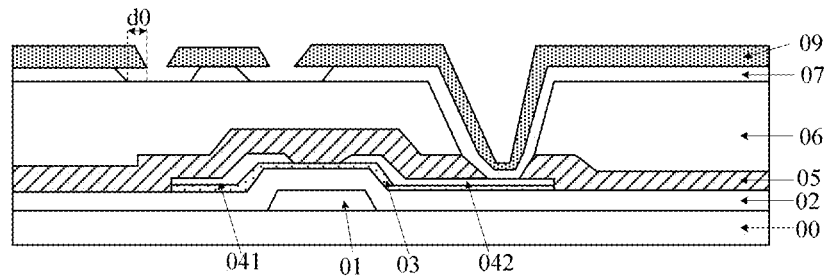
FIG. 1(a) is a schematic cross-sectional view of an array substrate of a reflective liquid crystal display device in a producing process thereof according to a related art.

For example, a reflective liquid crystal display device may include an array substrate, referring to FIG. 1(a). FIG. 1(a) is a schematic cross-sectional view of an array substrate of a reflective liquid crystal display device in a producing process thereof according to a related art. The array substrate may include a gate electrode 01, a gate insulation layer 02, an active layer 03, a source-drain metal layer including a source electrode 041 and a drain electrode 042, a passivation layer 05, a planarization layer 06, and a pixel electrode 07 disposed on a base substrate 00 in sequence. The pixel electrode 07 is made of a metal material, and the pixel electrode 07 in the array substrate may reflect light.

As shown in FIG. 1(a), a step of patterning a metal layer on the planarization layer 06 by one patterning process to form the pixel electrode 07 include: forming a photoresist layer over the metal layer; exposing and developing the photoresist layer to form a photoresist pattern 09; then etching the metal layer to form the pixel electrode 07 covered by the photoresist pattern 09; finally, stripping the photoresist pattern 09 to form the pixel electrode 07. Wet etching is usually used in the step of etching the metal layer, wet etching may reduce the cost compared to dry etching.

Figure 1:
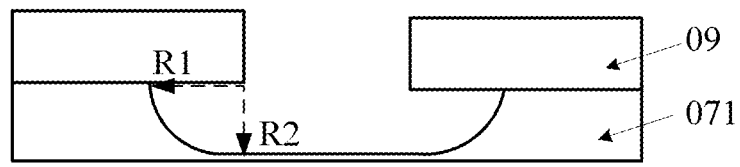
FIG. 1(b) is a schematic cross-sectional view of a metal layer in an etching process according to the related art.

However, the Applicant has found that, as shown in FIG. 1 (a), if the metal layer is etched directly by wet etching, an etching deviation d0 of the pixel electrode 07 is large. The etching deviation d0 is a difference in width between an orthogonal projection of the pixel electrode 07 on the base substrate 00 and an orthogonal projection of the photoresist pattern 09 on the base substrate 00. As a result, an area of the orthogonal projection of the finally formed pixel electrode 07 on the base substrate 00 is small, resulting in a low reflectivity of the reflective liquid crystal display device.

FIG. 1(b) is a schematic cross-sectional view of a metal layer in an etching process according to the related art. Please refer to FIG. 1(b), the photoresist pattern 09 is disposed on the metal layer 071, and a part of the metal layer 071 which is not covered by the photoresist pattern 09 is etched by a metal etching solution directly. An etching anisotropy of the metal layer 071 can be calculated by an etching anisotropy formula, the formula is as following:

$$A = 1 - \frac{R1}{R2}$$

In the formula, A is an etching anisotropy of a material, R1 is a lateral etching rate of the material in an etching process, and R2 is a longitudinal etching rate of the material in the etching process.

Normally, A is in a range from 0 to 1. According to the etching anisotropy formula, when A=1, there is no etching deviation after the etching process; when A=0, the etching deviation after the etching process is largest. Since the etching anisotropy of the metal layer is small, for example, in the wet etching, the lateral etching rate R1 of the metal layer is large, so that the etching deviation d0 of the pixel electrode after etching the metal layer is large. As a result, the area of the orthographic projection of the finally formed pixel electrode on the base substrate is small, which leads to the low reflectivity of the reflective liquid crystal display device.

A method of producing a metal electrode is provided in an embodiment of the present disclosure. The method may be used for producing various metal electrodes in the semiconductor field. The method includes steps as following:

forming a protection layer on a metal layer;

patterning the protection layer to form a protection pattern, a profile of the protection pattern is the same as a profile of a predetermined pattern of the metal electrode; and etching a part of the metal layer which is not covered by the protection pattern to form the metal electrode covered by the protection pattern.

An etching anisotropy of the protection layer is larger than an etching anisotropy of the metal layer. The protection pattern covers the metal layer so that an lateral etching rate of the metal layer is suppressed when the metal layer is etched, thereby reducing an etching deviation of the metal layer during an etching process, for example, during a wet etching process. Therefore, the metal electrode with the predetermined pattern may be precisely produced.

The metal electrode may be, for example, a pixel electrode, a reflective electrode, a common electrode, a gate electrode, a source electrode, a drain electrode, a gate line, a data line, a peripheral circuit and the like on an array substrate in a display device.

The method of producing the metal electrode will be explained hereinafter by taking steps of forming the pixel electrode in a method of producing the array substrate as an example.

Figure 2:
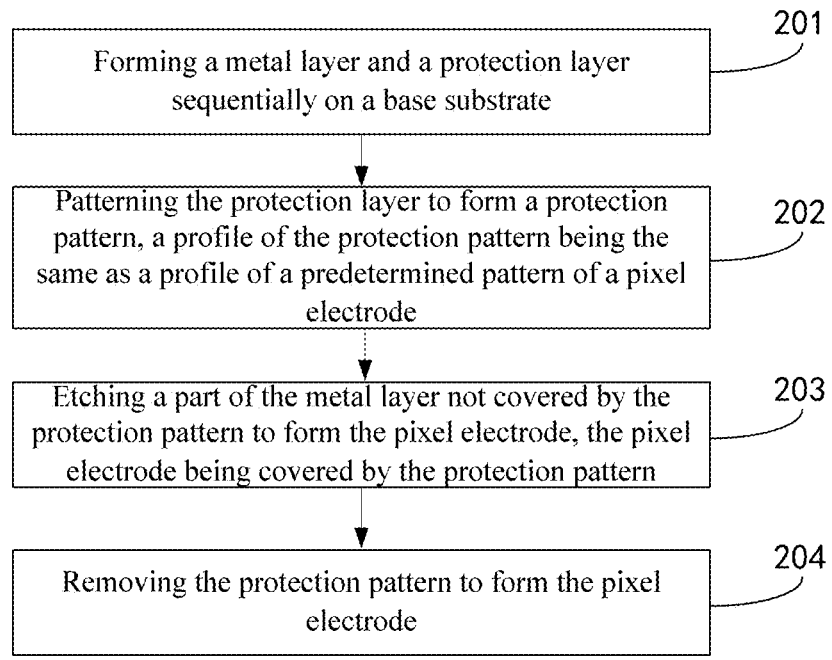
FIG. 2 is a flowchart of a method of producing an array substrate according to an embodiment of the present disclosure.

A method of producing an array substrate of a reflective liquid crystal display device is provided according to an embodiment of the present disclosure. A pixel electrode on the array substrate is made of a metal material such as copper, silver, aluminum, or an alloy of at least two of copper, silver and aluminum. FIG. 2 is a flowchart of a method of producing an array substrate according to an embodiment of the present disclosure. With reference to FIG. 2, the method may include the following steps 201-204.

In step 201, a metal layer and a protection layer are sequentially formed on a base substrate.

A metal material, such as copper, silver, aluminum, or an alloy of at least two of copper, silver and aluminum, is used to form the metal layer on the base substrate. Then the protection layer is formed on the metal layer, and the metal layer is covered by the protection layer completely. An etching anisotropy of the protection layer is larger than an etching anisotropy of the metal layer.

In step 202, the protection layer is patterned to form a protection pattern, and a profile of the protection pattern is the same as a profile of a predetermined pattern of the pixel electrode.

In step 203, a part of the metal layer which is not covered by the protection pattern is etched to form the pixel electrode covered by the protection pattern.

In step 204, the protection pattern is removed to form the pixel electrode.

In summary, in the method of producing the array substrate according to the embodiment of the present disclosure, since the etching anisotropy of the protection layer is larger than the etching anisotropy of the metal layer, when the protection layer is patterned and etched, the protection pattern to be formed has a small etching deviation, and the protection pattern may protect the metal layer and suppress the lateral etching rate of the metal layer. Therefore, an etching deviation of the pixel electrode formed by etching the metal layer is small, and an area of an orthographic projection of the pixel electrode on the base substrate is effectively increased, thereby further improving the reflectivity of the reflective liquid crystal display device.

In practical applications, the reflective liquid crystal display device may be an active type display or a passive type display. When the reflective type liquid crystal display device is the active type display, the array substrate of the reflective liquid crystal display device is provided with thin film transistors arranged in an array. When the reflective liquid crystal display device is the passive type display, the array substrate of the reflective liquid crystal display device is not provided with thin film transistors.

Figure 3:
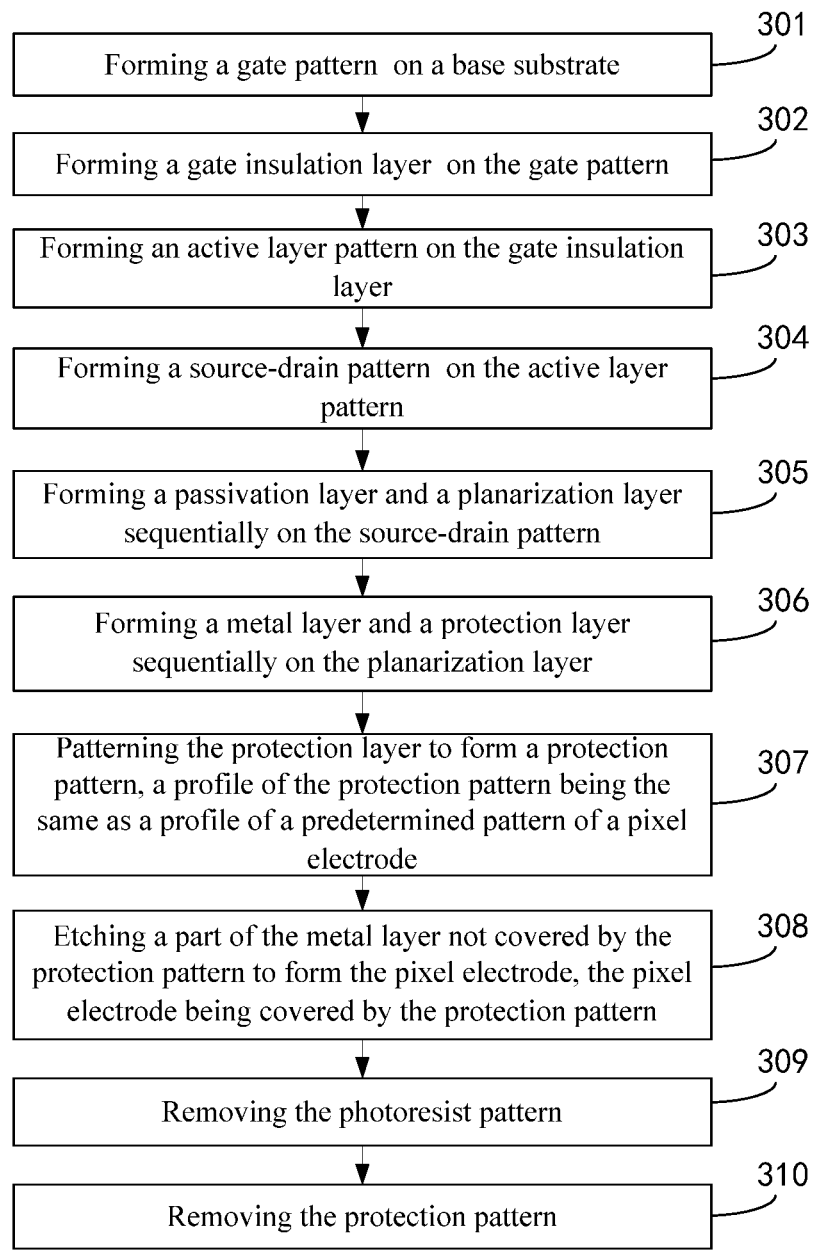
FIG. 3 is a flowchart of a method of producing an array substrate according to another embodiment of the present disclosure.

Hereinafter, the method of producing the array substrate will be explained in detail with reference to FIGS. 3 and 3(a) to 3(l). FIG. 3 is a flowchart of a method of producing an array substrate according to another embodiment of the present disclosure; FIGS. 3(a)-3(m) are schematic cross-sectional views of the array substrate after performing each of the steps of the method of FIG. 3.

As shown in FIG. 3, the method of producing an array substrate includes the following steps 301-310.

In step 301, a gate pattern is formed on a base substrate.

The gate pattern may include a gate electrode, and the gate pattern may be formed using a metal material. For example, the gate pattern is made of a metal material such as molybdenum (Mo), copper (Cu), aluminum (Al), an alloy or the like.

Figure 3A:
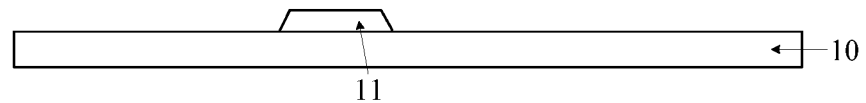
FIGS. 3(a)-3(l) are schematic cross-sectional views of the array substrate after performing each of the steps of the method in FIG. 3.

For example, referring to FIG. 3(a), a gate metal layer is formed on the base substrate 10 by any one of various manners such as deposition, coating, sputtering, etc., then the gate metal layer is patterned through one patterning process to form the gate pattern 11. One patterning process may include photoresist coating, exposing, developing, etching, and photoresist stripping.

In step 302, a gate insulation layer is formed on the gate pattern.

A material of the gate insulation layer may be silicon dioxide, silicon nitride, or a mixed material of silicon dioxide and silicon nitride.

Figure 3B:
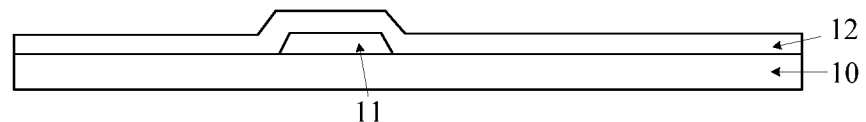

For example, referring to FIG. 3(b), the gate insulation layer 12 is formed on the base substrate 10 on which the gate pattern 11 is formed by any one of deposition, coating, sputtering and the like. The gate insulation layer 12 covers the entire surface of the base substrate 10 provided with the gate pattern 11.

In step 303, an active layer pattern is formed on the gate insulation layer.

The active layer pattern may be made of amorphous silicon, polysilicon, or the like.

Figure 3C:
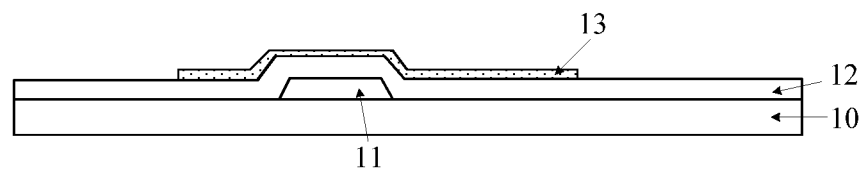

For example, referring to FIG. 3(c), an active layer is formed on the base substrate 10 provided with the gate insulation layer 12 by any one of various manners such as deposition, coating, sputtering, etc., then the active layer is patterned through one patterning process to form the active layer pattern 13. One patterning process may include photoresist coating, exposing, developing, etching, and photoresist stripping.

In step 304, a source-drain pattern is formed on the active layer pattern.

The source-drain pattern includes a source electrode and a drain electrode. The source-drain pattern may be made of a metal material such as molybdenum (Mo), copper (Cu), aluminum (Al), an alloy or the like.

Figure 3D:
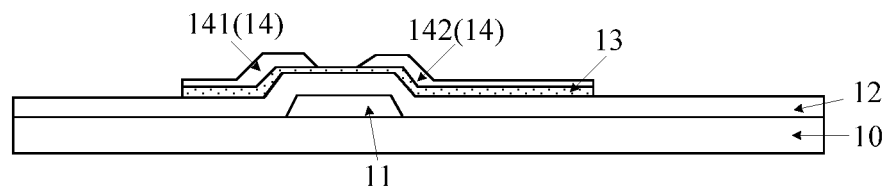

For example, referring to FIG. 3(d), an source-drain metal layer is formed on the base substrate 10 provided with the active layer pattern 13 by any one of various manners such as deposition, coating, sputtering, etc., then the source-drain metal layer is patterned through one patterning process to form the source-drain pattern 14. One patterning process may include photoresist coating, exposing, developing, etching, and photoresist stripping. The source-drain pattern 14 includes the source electrode 141 and the drain electrode 142. The source electrode 141, the drain electrode 142, the gate electrode and the active layer pattern 13 constitute a thin film transistor on the array substrate.

In step 305, a passivation layer and a planarization layer are sequentially formed on the source-drain pattern.

Both of the passivation layer and the planarization layer may be made of silicon dioxide, silicon nitride, or a mixed material of silicon dioxide and silicon nitride.

Figure 3E:
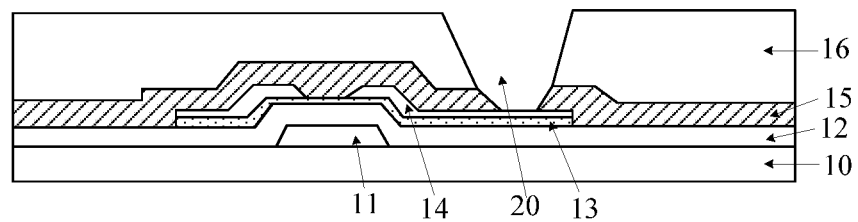

For example, referring to FIG. 3(e), the passivation layer 15 is formed on the base substrate 10 provided with the source-drain pattern 14 by any one of various manners such as deposition, coating, sputtering, etc., then the planarization layer 16 is formed on the base substrate 10 provided with the passivation layer 15 by any one of various manners such as deposition, coating, sputtering, etc., then the passivation layer 15 and the planarization layer 16 are patterned through one patterning process to form a via hole 20 penetrating both the passivation layer 15 and the planarization layer 16. One patterning process may include photoresist coating, exposing, developing, etching, and photoresist stripping.

In step 306, a metal layer for forming a pixel electrode and a protection layer are sequentially formed on the planarization layer.

The etching anisotropy of the protective layer is larger than the etching anisotropy of the metal layer. For example, the material of the metal layer is aluminum, copper, silver, or an alloy thereof, and the material of the protective layer is, for example ITO (Indium Tin Oxide).

Figure 3F:
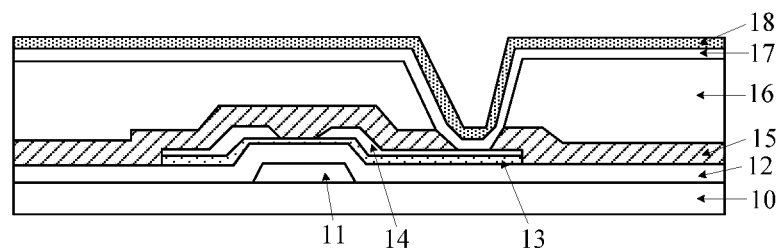

For example, referring to FIG. 3(f), the metal layer 17 is formed on the base substrate 10 provided with the planarization layer 16 by any one of various manners such as deposition, coating, sputtering, etc., then the protection layer 18 is formed on the base substrate 10 provided with the metal layer 17 by any one of various manners such as deposition, coating, sputtering, etc.

In step 307, the protection layer is patterned though one patterning process to form a protection pattern, and a profile of the protection pattern is the same as a profile of a predetermined pattern of the pixel electrode.

Specifically, firstly, a photoresist layer is formed over the protection layer.

Figure 3G:
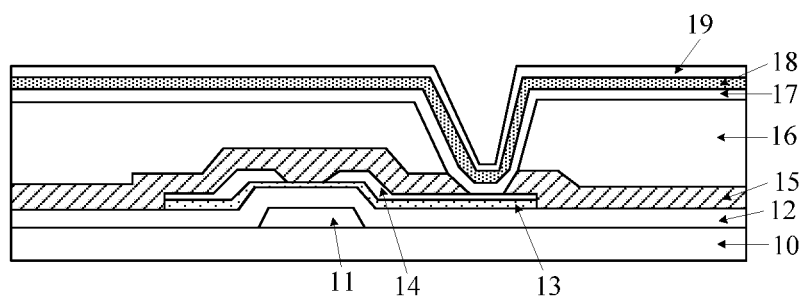

For example, referring to FIG. 3(g), a photoresist layer 19 is formed on the base substrate 10 on which the protection layer 18 has been formed.

Next, the photoresist layer is exposed and developed to form a photoresist pattern and a profile of the photoresist pattern is the same as the profile of the predetermined pattern of the pixel electrode.

Figure 3H:
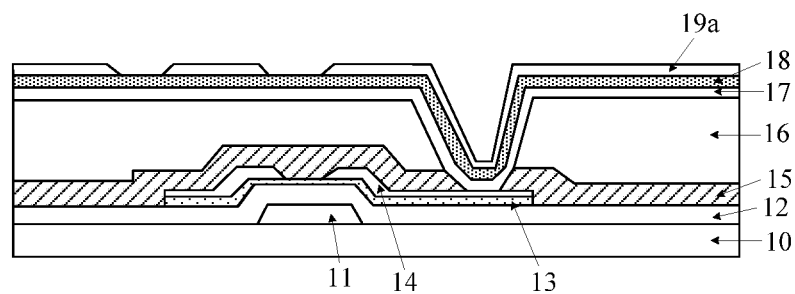

For example, referring to FIG. 3(h), the photoresist layer 19 is exposed by using a mask. The mask has a mask pattern. A profile of the mask pattern is the same as the profile of the predetermined pattern of the pixel electrode. The exposed photoresist layer is further developed so that the photoresist pattern 19a, a profile of which is the same as the profile of the predetermined pattern of the pixel electrode, is formed, and at least a part of the protection layer 18 is not covered by the photoresist pattern 19a.

Then, the protection layer is etched to form the protection pattern. A profile of the protection pattern is the same as the profile of the predetermined pattern of the pixel electrode.

Figure 3I:
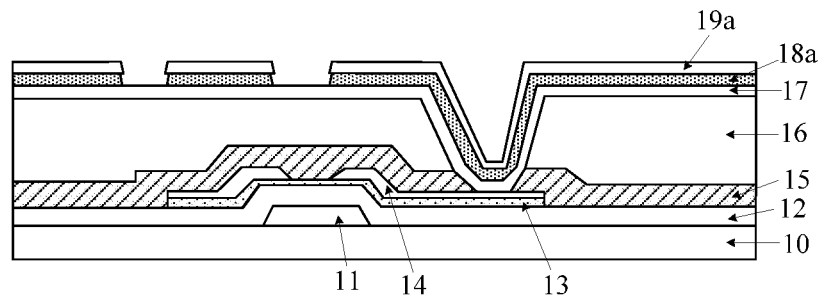

For example, referring to FIG. 3(i), the protection layer 18 is made of ITO (indium tin oxide), therefore the protection layer 18 partially covered by the photoresist pattern 19a is etched by an ITO etching solution in a first etching process. The part of the protection layer 18 which is not covered by the photoresist pattern 19a is etched away, leaving a part of the protection layer covered by the photoresist pattern 19a, thereby forming the protection pattern 18a. Since an etching deviation of the protection layer 18 is small, the profile of the protection pattern 18a is substantially the same as the profile of the photoresist pattern 19a. The protection pattern 18a and the photoresist pattern 19a having the same profile are stacked on each other, and the protection pattern 18a is located between the photoresist pattern 19a and the base substrate 10.

In step 308, a part of the metal layer which is not covered by the protection pattern 18a is etched away to form the pixel electrode covered by the protection pattern 18a.

Figure 3J:
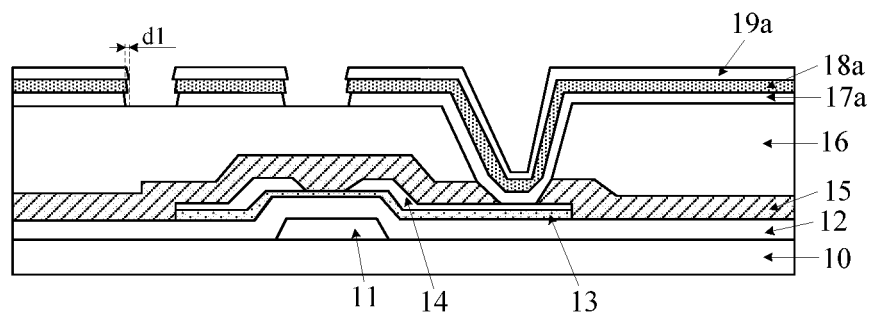

For example, referring to FIG. 3(j), the metal layer, which is partially covered by the photoresist pattern 19a and the protection pattern 18a, is etched by a metal etching solution in a second etching process. A part of the metal layer 17, which is not covered by the photoresist pattern 19a and the protection pattern 18a, is etched away, leaving a part of the metal layer 17 which is covered by both the photoresist pattern 19a and the protection pattern 18a, thereby forming a metal layer pattern, i.e. the pixel electrode 17a. A profile of the pixel electrode 17a is substantially the same as the profiles of the protection pattern 18a and the photoresist pattern 19a.

The etching anisotropy of the protection layer is large, therefore the etching deviation of the protection pattern formed by the first etching process is small. Moreover, the adhesion between the protection layer and the metal layer is good, so that the protection pattern may be in close contact with the metal layer. In this way, the protection pattern may protect the metal layer during the second etching process, and suppress the lateral etching rate of the metal layer, so that the etching deviation of the pixel electrode formed by the second etching process is small.

In practical applications, experiments shows that, as shown in FIG. 1(a), the etching deviation d0 of the pixel electrode 07 formed in the related art is about 0.9 µm; in contrast, as shown in FIG. 3(j), the etching deviation dl of the pixel electrode 17a, formed in the method of producing the array substrate according to an embodiment of the present disclosure, is about 0.15 µm. The mask used in the method of producing the array substrate according to the embodiment of the present disclosure is the same as a mask used in the method of producing the array substrate in the related art, in this case, the etching deviation of the metal layer formed by the method according to the embodiment of the present disclosure is significantly reduced compared with that in the related art. Therefore, the method of producing the array substrate provided according to the embodiment of the present disclosure may increase the area of the orthogonal projection of the pixel electrode on the substrate effectively, thereby effectively improving the reflectivity of the reflective liquid crystal display device.

In step 309, the photoresist pattern is removed.

Figure 3K:
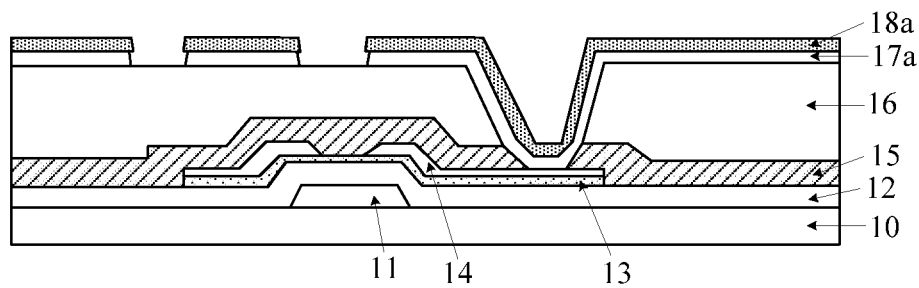

For example, referring to FIG. 3(k), the photoresist pattern 19a on the protection pattern 18a is stripped, in this way, the pixel electrode 17a is covered by the protection pattern 18a.

In step 310, the protection pattern is removed.

Figure 3L:
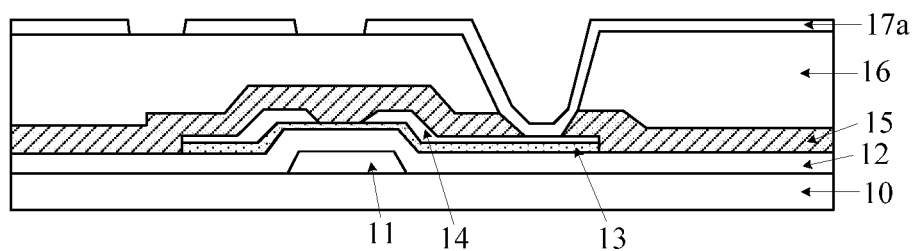

For example, referring to FIG. 3(l), the protection pattern 18a on the pixel electrode 17a is etched away by the ITO etching solution in a third etching process.

In another embodiment, the step of removing the photoresist pattern may be performed prior to etching the metal layer.

In addition, those skilled in the art can understand that the steps in the above embodiments are not all necessary, and some steps may be omitted according to actual requirements, and the order of the steps is not limited, and the order may be adjusted according to actual needs.

The above embodiments are schematically illustrated by taking an array substrate, especially a bottom-gate type array substrate of an active reflective liquid crystal display device as an example. Those skilled in the art can understand that other types of array substrates, such as top-gate type array substrates, may be produced by a similar method.

In summary, in the method of producing the array substrate according to embodiments of the present disclosure, since the etching anisotropy of the protection layer is larger than the etching anisotropy of the metal layer, when the protection layer is patterned to form the protection pattern, the etching deviation of the protection pattern is small, and the protection layer pattern may protect the metal layer and suppress the lateral etching rate of the metal layer when the metal layer is etched, therefore the etching deviation of the formed pixel electrode is small, thereby effectively increasing the area of the orthographic projection of the pixel electrode on the base substrate, thus effectively increasing the reflectivity of the reflective liquid crystal display device.

An array substrate is provided according to an embodiment of the present disclosure, the array substrate may be produced by the method in the above embodiments. For example, the structure of the array substrate produced by the method in the above embodiments may refer to FIG. 3(l).

A reflective display device is provided according to an embodiment of the present disclosure, the reflective display device may include the array substrate shown in FIG. 3(m). The reflective display may be any product or component with display function such as an electronic paper, a mobile phone, a tablet computer, a television, a notebook, a digital photo frame, a navigation device, and the like.

The foregoing descriptions are merely exemplary embodiments of the present disclosure and are not intended to limit the present disclosure. Any modification, equivalent replacement, or improvement made within the spirit and principle of the present disclosure shall be included in the protection scope of the present disclosure.

What is claimed is:

1. A method of producing a metal electrode, comprising:
   forming a protection layer on a metal layer;
   patterning the protection layer to form a protection pattern, a profile of the protection pattern being the same as a profile of a predetermined pattern of the metal electrode; and
   etching a part of the metal layer not covered by the protection pattern to form the metal electrode, the metal electrode being covered by the protection pattern,
   wherein an etching anisotropy of the protection layer is larger than an etching anisotropy of the metal layer,
   wherein a material of the protection layer comprises indium tin oxide (ITO).

2. The method of claim 1, wherein the step of patterning the protection layer to form a protection pattern comprises:
   forming a photoresist layer over the protection layer;

exposing and developing the photoresist layer to form a photoresist pattern, a profile of the photoresist pattern being the same as the profile of the predetermined pattern of the metal electrode; and etching a part of the protection layer not covered by the photoresist pattern to form the protection pattern, the protection pattern being covered by the photoresist pattern.

3. The method of claim 2, wherein after the step of etching a part of the metal layer not covered by the protection pattern to form the metal electrode, the metal electrode being covered by the protection pattern, the method further comprises:

removing the photoresist pattern; and removing the protection pattern.

4. The method of claim 2, wherein after the step of etching a part of the protection layer not covered by the photoresist pattern to form the protection pattern, the protection pattern being covered by the photoresist pattern, the step of patterning the protection layer to form the protection pattern further comprises:

removing the photoresist pattern.

5. The method of claim 1, further comprising:

removing the protection pattern to form the metal electrode.

6. The method of claim 1, wherein before the step of forming the protection layer on the metal layer, the method further comprises:

forming the metal layer on a base substrate.

7. The method of claim 1, wherein the metal electrode comprises at least one of a pixel electrode, a gate electrode, a source electrode, a drain electrode, a gate line, and a data line.

8. The method of claim 1, wherein a material of the metal layer comprises aluminum, copper, silver, or an alloy thereof.

9. The method of claim 1, wherein the step of etching a part of the metal layer not covered by the protection pattern comprises: etching the part of the metal layer by a wet etching process.

10. A method of producing an array substrate, comprising the method of claim 1.

11. The method of claim 10, further comprising:

forming the metal layer and at least one of a gate electrode, a gate line, a gate insulation layer, an active layer, a source electrode, a drain electrode, a data line, a passivation layer, and a planarization layer on a base substrate, wherein the metal electrode comprises a pixel electrode.

12. An array substrate, wherein the array substrate is produced by the method of claim 10.

13. An array substrate, wherein the array substrate is produced by the method of claim 11.

14. A display device, comprising the array substrate of claim 12.

15. The display device of 14, wherein the display device comprises a reflective display device.

* * * * *